United States Patent
Ye

(10) Patent No.: US 9,323,267 B2
(45) Date of Patent: Apr. 26, 2016

(54) METHOD AND IMPLEMENTATION FOR ELIMINATING RANDOM PULSE DURING POWER UP OF DIGITAL SIGNAL CONTROLLER

(71) Applicant: Flextronics AP, LLC, Broomfield, CO (US)

(72) Inventor: Zhen Z. Ye, Garland, TX (US)

(73) Assignee: Flextronics AP, LLC, Broomfield, CO (US)

( * ) Notice: Subject to any disclaimer, the term of this patent is extended or adjusted under 35 U.S.C. 154(b) by 272 days.

(21) Appl. No.: 13/829,972

(22) Filed: Mar. 14, 2013

(65) Prior Publication Data

US 2014/0266082 A1    Sep. 18, 2014

(51) Int. Cl.
| | |
|---|---|
| *H02M 1/00* | (2007.01) |
| *G05F 1/67* | (2006.01) |
| *H03K 7/08* | (2006.01) |
| *H03K 5/125* | (2006.01) |
| *H02M 1/36* | (2007.01) |
| *H02M 1/42* | (2007.01) |

(52) U.S. Cl.
CPC . *G05F 1/67* (2013.01); *H02M 1/36* (2013.01); *H03K 5/125* (2013.01); *H03K 7/08* (2013.01); *H02M 1/4208* (2013.01); *H02M 2001/0012* (2013.01)

(58) Field of Classification Search
CPC ... H02M 1/36; H02M 1/4208; H02M 1/0845; H02M 2001/0012; H02M 2001/0038; H02M 3/157; H02M 2003/1586
See application file for complete search history.

(56) References Cited

U.S. PATENT DOCUMENTS

| | | | |
|---|---|---|---|
| 4,234,920 A | 11/1980 | Van Ness et al. |
| 4,273,406 A | 6/1981 | Okagami |
| 4,327,298 A | 4/1982 | Burgin |
| 4,370,703 A | 1/1983 | Risberg |
| 4,563,731 A | 1/1986 | Sato et al. |

(Continued)

FOREIGN PATENT DOCUMENTS

| | | |
|---|---|---|
| EP | 1146630 A2 | 10/2001 |
| JP | 4217869 A | 8/1992 |

(Continued)

OTHER PUBLICATIONS

EE Times.com—"Team Claims Midrange Wireless Energy Transfer", by R. Colin Johnson, 4 pages, Nov. 6, 2007.

(Continued)

*Primary Examiner* — Matthew Nguyen
(74) *Attorney, Agent, or Firm* — Haverstock & Owens LLP

(57) ABSTRACT

A switching mode power converter includes a DSC with a digital PWM module configured for complementary operation mode during normal operation. The control algorithm of the DSC is configured such that during an initialization stage immediately following power up of the device relevant digital PWM modules used for interleaving operation are reconfigured to temporarily operate in an independent operation mode with the duty cycle associated with each channel set at zero. The reconfigured digital PWM modules remain set in the independent operation mode for a predefined period of time. Once the predefined time period is reached, the reconfigured digital PWM modules are again reconfigured back to the original complementary operation mode configuration and the control algorithm resumes normal operation of the DSC and digital PWM modules.

21 Claims, 4 Drawing Sheets

(56) References Cited

U.S. PATENT DOCUMENTS

| | | |
|---|---|---|
| 4,611,289 A | 9/1986 | Coppola |
| 4,642,616 A | 2/1987 | Goodwin |
| 4,645,278 A | 2/1987 | Yevak et al. |
| 4,658,204 A | 4/1987 | Goodwin |
| 4,703,191 A | 10/1987 | Ferguson |
| 4,712,160 A | 12/1987 | Sato et al. |
| 4,742,424 A | 5/1988 | Kautzer et al. |
| 4,788,626 A | 11/1988 | Neidig et al. |
| 4,806,110 A | 2/1989 | Lindeman |
| 4,841,220 A | 6/1989 | Tabisz et al. |
| 4,857,822 A | 8/1989 | Tabisz et al. |
| 4,866,367 A | 9/1989 | Ridley et al. |
| 4,890,217 A | 12/1989 | Conway |
| 4,893,227 A | 1/1990 | Gallios et al. |
| 4,899,256 A | 2/1990 | Sway-Tin |
| 4,901,069 A | 2/1990 | Veneruso |
| 4,985,804 A | 1/1991 | Campbell et al. |
| 5,065,302 A | 11/1991 | Kanazawa |
| 5,090,919 A | 2/1992 | Tsuji |
| 5,101,322 A | 3/1992 | Ghaem et al. |
| 5,105,182 A | 4/1992 | Shindo |
| 5,126,931 A | 6/1992 | Jitaru |
| 5,132,890 A | 7/1992 | Blandino |
| 5,235,491 A | 8/1993 | Weiss |
| 5,283,792 A | 2/1994 | Davies et al. |
| 5,325,283 A | 6/1994 | Farrington |
| 5,365,403 A | 11/1994 | Vinciarelli et al. |
| 5,373,432 A | 12/1994 | Vollin |
| 5,434,768 A | 7/1995 | Jitaru et al. |
| 5,437,040 A | 7/1995 | Campbell et al. |
| 5,442,540 A | 8/1995 | Hua |
| 5,459,652 A | 10/1995 | Faulk |
| 5,673,185 A | 9/1997 | Albach et al. |
| 5,712,772 A | 1/1998 | Telefus et al. |
| 5,717,936 A | 2/1998 | Uskali |
| 5,768,118 A | 6/1998 | Faulk et al. |
| 5,786,992 A | 7/1998 | Vinciarelli et al. |
| 5,790,395 A | 8/1998 | Hagen |
| 5,811,895 A | 9/1998 | Suzuki et al. |
| 5,838,171 A | 11/1998 | Davis |
| 5,838,554 A | 11/1998 | Lanni |
| 5,859,771 A | 1/1999 | Kniegl |
| 5,874,841 A | 2/1999 | Majid et al. |
| 5,903,452 A | 5/1999 | Yang |
| 5,905,369 A | 5/1999 | Ishii et al. |
| 5,923,543 A | 7/1999 | Choi |
| 5,949,672 A | 9/1999 | Bernet |
| 5,978,238 A | 11/1999 | Liu |
| 6,009,008 A | 12/1999 | Pelly |
| 6,091,611 A | 7/2000 | Lanni |
| 6,183,302 B1 | 2/2001 | Daikuhara et al. |
| 6,191,957 B1 | 2/2001 | Peterson |
| 6,272,015 B1 | 8/2001 | Mangtani |
| 6,275,397 B1 | 8/2001 | McClain |
| 6,307,761 B1 | 10/2001 | Nakagawa |
| 6,323,627 B1 | 11/2001 | Schmiederer et al. |
| 6,331,794 B1 | 12/2001 | Blanchard |
| 6,356,465 B2 | 3/2002 | Yasumura |
| 6,366,476 B1 | 4/2002 | Yasumura |
| 6,385,059 B1 | 5/2002 | Telefus et al. |
| 6,388,897 B1 | 5/2002 | Ying et al. |
| 6,390,854 B2 | 5/2002 | Yamamoto et al. |
| 6,396,716 B1 | 5/2002 | Liu et al. |
| 6,452,816 B2 | 9/2002 | Kuranuki |
| 6,459,175 B1 | 10/2002 | Potega |
| 6,487,098 B2 | 11/2002 | Malik et al. |
| 6,507,174 B1 | 1/2003 | Qian |
| 6,549,409 B1 | 4/2003 | Saxelby et al. |
| 6,578,253 B1 | 6/2003 | Herbert |
| 6,721,192 B1 | 4/2004 | Yang et al. |
| 6,775,162 B2 | 8/2004 | Mihai et al. |
| 6,894,461 B1 | 5/2005 | Hack et al. |
| 6,919,715 B2 | 7/2005 | Muratov et al. |
| 6,989,997 B2 | 1/2006 | Xu et al. |
| 7,035,126 B1 | 4/2006 | Lanni |
| 7,038,406 B2 | 5/2006 | Wilson |
| 7,061,195 B2 | 6/2006 | Ho et al. |
| 7,102,251 B2 | 9/2006 | West |
| 7,139,180 B1 | 11/2006 | Herbert |
| 7,202,640 B2 | 4/2007 | Morita |
| 7,205,752 B2 | 4/2007 | Jansen |
| 7,208,833 B2 | 4/2007 | Nobori et al. |
| 7,212,420 B2 | 5/2007 | Liao |
| 7,215,560 B2 | 5/2007 | Soldano et al. |
| 7,239,532 B1 | 7/2007 | Hsu et al. |
| 7,274,175 B2 | 9/2007 | Manolescu |
| 7,315,460 B2 | 1/2008 | Kyono |
| 7,386,286 B2 | 6/2008 | Petrovic et al. |
| 7,450,388 B2 | 11/2008 | Beihoff et al. |
| 7,459,893 B2 | 12/2008 | Jacobs |
| 7,564,706 B1 | 7/2009 | Herbert |
| 7,570,037 B2 * | 8/2009 | Li .................. H02M 3/157 323/283 |
| 7,596,007 B2 | 9/2009 | Phadke et al. |
| 7,605,570 B2 | 10/2009 | Liu et al. |
| 7,630,221 B2 | 12/2009 | Sui et al. |
| 7,679,347 B2 * | 3/2010 | He et al. .................. 323/282 |
| 7,701,305 B2 | 4/2010 | Lin et al. |
| 7,730,676 B2 | 6/2010 | Hon |
| 7,755,914 B2 | 7/2010 | Telefus et al. |
| 7,760,519 B2 | 7/2010 | Telefus et al. |
| 7,830,684 B2 | 11/2010 | Taylor |
| 7,924,578 B2 | 4/2011 | Jansen et al. |
| 7,940,533 B2 | 5/2011 | Mansfield et al. |
| 7,978,489 B1 | 7/2011 | Telefus et al. |
| 8,018,743 B2 | 9/2011 | Wang et al. |
| 8,040,117 B2 | 10/2011 | Telefus |
| 8,059,429 B2 | 11/2011 | Huynh |
| 8,059,434 B2 | 11/2011 | Huang et al. |
| 8,077,489 B2 | 12/2011 | Pellen |
| 8,094,473 B2 | 1/2012 | Moon et al. |
| 8,102,678 B2 | 1/2012 | Jungreis |
| 8,125,181 B2 | 2/2012 | Gregg et al. |
| 8,126,181 B2 | 2/2012 | Yamamoto et al. |
| 8,134,848 B2 | 3/2012 | Whittam et al. |
| 8,155,368 B2 | 4/2012 | Cheung et al. |
| 8,193,662 B1 | 6/2012 | Carlson et al. |
| 8,194,417 B2 | 6/2012 | Chang |
| 8,199,541 B2 | 6/2012 | Yang |
| 8,207,717 B2 | 6/2012 | Uruno et al. |
| 8,233,298 B2 | 7/2012 | Jang |
| 8,243,472 B2 | 8/2012 | Chang et al. |
| 8,279,646 B1 | 10/2012 | Hamstra |
| 8,289,741 B2 | 10/2012 | Jungreis |
| 8,344,689 B2 | 1/2013 | Boguslavskij |
| 8,363,434 B2 | 1/2013 | Lin |
| 8,369,111 B2 | 2/2013 | Balakrishnan et al. |
| 8,385,032 B1 | 2/2013 | Mao et al. |
| 8,400,801 B2 | 3/2013 | Shinoda |
| 8,410,768 B2 | 4/2013 | Huber et al. |
| 8,441,810 B2 | 5/2013 | Telefus et al. |
| 8,488,340 B2 | 7/2013 | Zhang et al. |
| 8,520,410 B2 | 8/2013 | Telefus et al. |
| 8,654,553 B1 | 2/2014 | Ye et al. |
| 8,749,210 B1 | 6/2014 | Nakao et al. |
| 8,780,597 B2 | 7/2014 | Xu |
| 2001/0036091 A1 | 11/2001 | Yasumura |
| 2002/0008963 A1 | 1/2002 | DiBene et al. |
| 2002/0011823 A1 | 1/2002 | Lee |
| 2002/0036200 A1 | 3/2002 | Ulrich |
| 2003/0035303 A1 | 2/2003 | Balakrishnan et al. |
| 2003/0112645 A1 | 6/2003 | Schlecht |
| 2004/0062061 A1 | 4/2004 | Bourdillon |
| 2004/0149551 A1 | 8/2004 | Porter |
| 2004/0183510 A1 | 9/2004 | Sutardja et al. |
| 2004/0252529 A1 | 12/2004 | Huber et al. |
| 2005/0024016 A1 | 2/2005 | Breen et al. |
| 2005/0036338 A1 | 2/2005 | Porter et al. |
| 2005/0117376 A1 | 6/2005 | Wilson |
| 2005/0138437 A1 | 6/2005 | Allen et al. |
| 2005/0194942 A1 | 9/2005 | Hack et al. |
| 2005/0225257 A1 | 10/2005 | Green |
| 2005/0254268 A1 | 11/2005 | Reinhard et al. |
| 2005/0270001 A1 | 12/2005 | Jitaru |

(56) References Cited

U.S. PATENT DOCUMENTS

| | | |
|---|---|---|
| 2006/0002155 A1 | 1/2006 | Shteynberg et al. |
| 2006/0022637 A1 | 2/2006 | Wang et al. |
| 2006/0152947 A1 | 7/2006 | Baker et al. |
| 2006/0198172 A1 | 9/2006 | Wood |
| 2006/0208711 A1 | 9/2006 | Soldano |
| 2006/0213890 A1 | 9/2006 | Kooken et al. |
| 2006/0232220 A1 | 10/2006 | Melis |
| 2006/0291512 A1* | 12/2006 | Borschowa ............... 372/38.02 |
| 2007/0040516 A1 | 2/2007 | Chen |
| 2007/0086224 A1 | 4/2007 | Phadke et al. |
| 2007/0087784 A1 | 4/2007 | Yamamoto et al. |
| 2007/0120542 A1 | 5/2007 | LeMay |
| 2007/0121981 A1 | 5/2007 | Koh et al. |
| 2007/0138971 A1 | 6/2007 | Chen |
| 2007/0242487 A1 | 10/2007 | Orr |
| 2007/0247091 A1 | 10/2007 | Maiocchi |
| 2007/0263415 A1 | 11/2007 | Jansen et al. |
| 2007/0279955 A1 | 12/2007 | Liu et al. |
| 2007/0298653 A1 | 12/2007 | Mahoney et al. |
| 2008/0002444 A1 | 1/2008 | Shekhawat et al. |
| 2008/0018265 A1 | 1/2008 | Lee et al. |
| 2008/0043496 A1 | 2/2008 | Yang |
| 2008/0191667 A1 | 8/2008 | Kernahan et al. |
| 2009/0034299 A1 | 2/2009 | Lev |
| 2009/0045889 A1 | 2/2009 | Goergen et al. |
| 2009/0196073 A1 | 8/2009 | Nakahori |
| 2009/0207637 A1 | 8/2009 | Boeke |
| 2009/0230929 A1 | 9/2009 | Sui et al. |
| 2009/0290384 A1 | 11/2009 | Jungreis |
| 2009/0300400 A1 | 12/2009 | DuBose |
| 2010/0039833 A1 | 2/2010 | Coulson et al. |
| 2010/0103711 A1 | 4/2010 | Komatsuzaki |
| 2010/0110732 A1 | 5/2010 | Moyer |
| 2010/0254057 A1 | 10/2010 | Chen |
| 2010/0277837 A1 | 11/2010 | Myhre |
| 2010/0289466 A1 | 11/2010 | Telefus |
| 2010/0317216 A1 | 12/2010 | Pocrass |
| 2010/0322441 A1 | 12/2010 | Weiss et al. |
| 2010/0332857 A1 | 12/2010 | Vogman |
| 2011/0037444 A1 | 2/2011 | Wildash |
| 2011/0132899 A1 | 6/2011 | Shimomugi et al. |
| 2011/0211376 A1 | 9/2011 | Hosotani |
| 2011/0222318 A1 | 9/2011 | Uno et al. |
| 2011/0261590 A1 | 10/2011 | Liu |
| 2012/0069609 A1 | 3/2012 | Christophe et al. |
| 2012/0112657 A1 | 5/2012 | Van Der Veen et al. |
| 2012/0113686 A1 | 5/2012 | Telefus et al. |
| 2012/0144183 A1 | 6/2012 | Heinrichs et al. |
| 2012/0153917 A1 | 6/2012 | Adell et al. |
| 2012/0268084 A1 | 10/2012 | Wang et al. |
| 2013/0003427 A1 | 1/2013 | Pan |
| 2013/0016545 A1 | 1/2013 | Xu |
| 2013/0027011 A1 | 1/2013 | Shih et al. |
| 2013/0049709 A1 | 2/2013 | Fu et al. |
| 2013/0148385 A1 | 6/2013 | Zhang |
| 2013/0155728 A1 | 6/2013 | Melanson et al. |
| 2013/0329469 A1 | 12/2013 | Kubota |
| 2014/0153299 A1 | 6/2014 | Jeong et al. |
| 2014/0268912 A1 | 9/2014 | Telefus |
| 2015/0002108 A1 | 1/2015 | Kim |

FOREIGN PATENT DOCUMENTS

| | | |
|---|---|---|
| JP | 10243640 A | 9/1998 |
| JP | 11202027 A | 7/1999 |
| JP | 2000083374 A | 3/2000 |
| JP | 20000253648 A | 9/2000 |
| JP | 2004208357 A | 7/2004 |

OTHER PUBLICATIONS

Ee Times. com—"Wireless Beacon Could Recharge Consumer Devices", by R. Colin Johnson, 3 pages, Nov. 6, 2007.

Novel Zero-Voltage and Zero-Current Switching (ZVZCS) Full Bridge PWM converter Using Coupled Output Inductor, Sep. 2002 IEEE, pp. 641-648.

"New Architectures for Radio-Frequency dc/dc Power Conversion", Juan Rivas et al., Laboratory for Electromagnetic and Electronic Systems, Jan. 2004, Massachusetts Institute of Technology, Room 10-171 Cambridge, MA 02139, pp. 4074-4084.

"Randomized Modulation in Power Electronic Converters". Aleksander M. Stankovic, member IEEE, and Hanoch Lev-Ari, vol. 90, No. 5, May 2002, pp. 782-799.

"Analysis and Special Characteristics of a Spread-Spectrum Technique for Conducted EMI Suppression", K.K. tse, et al. Member IEEE, IEEE Transactions on Power Electronics, vol. 15., No. 2, Mar. 2000, pp. 399-410.

* cited by examiner

Fig. 2 M1CHA in independent operation mode

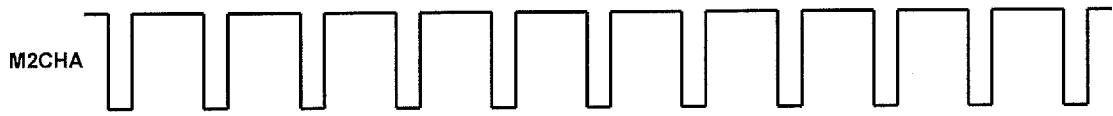

Fig. 3 M2CHA in complementary operation mode with M2CHB

Fig. 4 M2CHB in complementary operation mode with M2CHA

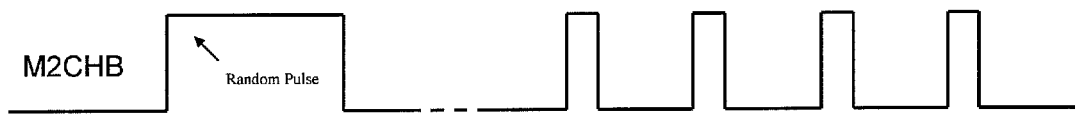

Fig. 5 Output of M2CHB in complementary operation mode during power-up

Fig. 6 Output of M1CHA during power-up

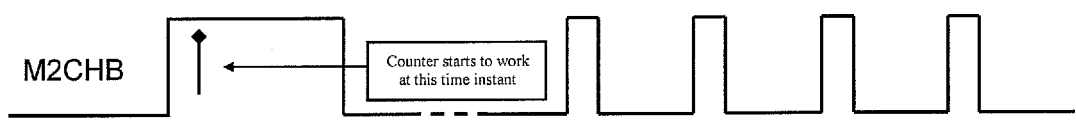

Fig. 7 Output of M2CHB in complementary operation mode with a software counter

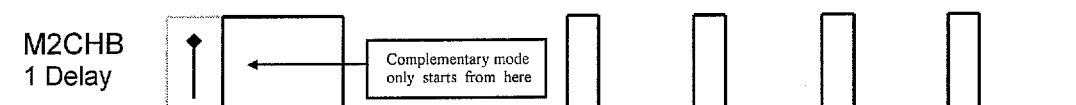

Fig. 8 Output of M2CHB in complementary operation mode after one time delay

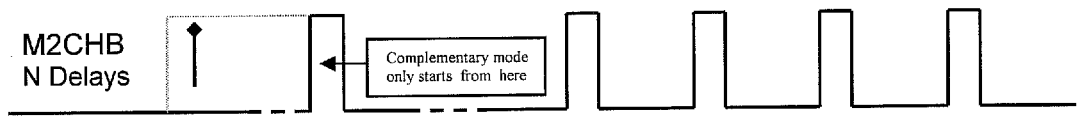
Fig. 9 Output of M2CHB in complementary mode after N time delays
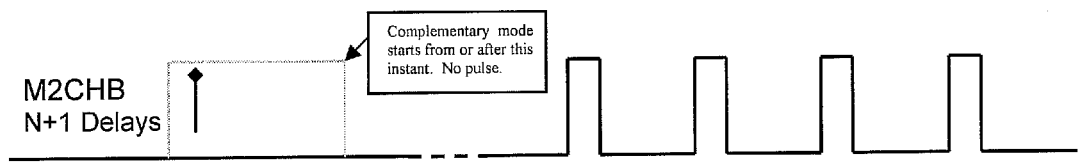
Fig. 10 Output of M2CHB in complementary mode after N+1 time delays

METHOD AND IMPLEMENTATION FOR ELIMINATING RANDOM PULSE DURING POWER UP OF DIGITAL SIGNAL CONTROLLER

FIELD OF THE INVENTION

The present invention is generally directed to the field of power supplies. More specifically, the present invention is directed to eliminating random pulse from pulse width modulation output during power up of digital signal controller in an AC-to-DC power supply.

BACKGROUND OF THE INVENTION

A digital signal controller (DSC) includes functionality of a microcontroller and a digital signal processors (DSPs). Similar to a microcontroller, a typical DSC includes controlled peripherals such as pulse wide modulation (PWM) modules and timers. Similar to DSPs, a typical DSC includes single-cycle multiply-accumulate (MAC) units, barrel shifters, and large accumulators. Not all vendors have adopted the term DSC, some continue to use the term microcontroller although such microcontrollers include the added functionality typically associated with a DSP. DSCs are used in a wide range of applications including, but not limited to, power conversion, motor control, and sensor processing applications.

PWM modules are commonly used for controlling power delivered to a load, such as an electrical device. A PWM module generates a PWM signal that drives a switch. The average value of voltage (and current) fed to the load is controlled by turning the switch ON and OFF. The longer the switch is ON compared to OFF, the higher the power supplied to the load. The duty cycle describes the proportion of ON time to the total period of the PWM signal. A low duty cycle corresponds to low power, because the power is OFF for most of the time. Duty cycle is expressed in percent, 100% being fully ON. PWM works well with the ON/OFF nature of digital controls, which can easily set the needed duty cycle.

DSC vendors typically design the DSC to include a general purpose digital PWM module. It is left to the device manufacturer into which the DSC is installed to specifically configure the digital PWM module. The DSC is configured to execute a control algorithm, which in part provides an input to the digital PWM for controlling the duty cycle. In the case where the DSC is used in a switching mode power converter, controlling the duty cycle of the digital PWM enables regulation of the power converter output voltage.

It is a common application for a digital PWM to be configured with multiple channels for interleaving operation. In an exemplary application, a DSC is included in a switching mode power converter having digital PWM module with two channels. The digital PWM is configured to operate in one of two operation modes, an independent operation mode and a complementary operation mode. In the independent operation mode, the two channels are operated independently of each other, for example the duty cycle for each channel is independent. In the complementary operation mode, each of the two channels is correlated as a complement of each other where the PWM signal for the second channel is phase shifted 180 degrees from the PWM signal for the first channel. For example, if the first channel is operating at 10% duty cycle, then the second channel is operating at 90% duty cycle. As such, in the complementary operation mode, the channels can not operate independently. Instead, the duty cycle of the second channel is restricted to the complement of the first channel duty cycle. The mode is set in firmware that controls the DSC.

The complementary operation mode is the common operation mode used to achieve the desired pulse width for power factor correction (PFC) interleaving operation. However, DSCs provided by certain vendors suffer from random pulses during device power up when configured for complementary operation mode. Power up is that period of time immediately following the device being turned ON and the device stabilizing at normal operating conditions. In the case of power supplies, random pulses output from the digital PWM may damage or destroy a PFC front-end circuit due to saturation of the magnetic component within the PFC front-end circuit.

SUMMARY OF THE INVENTION

Embodiments are directed to a method of eliminating random pulses during power up of a device. In an exemplary application, a switching mode power converter includes a DSC with a digital PWM module configured for complementary operation mode during normal operation. The method is implemented as a modification to the control algorithm of the DSC such that during an initialization stage immediately following power up of the device relevant digital PWM modules used for interleaving operation are reconfigured to temporarily operate in an independent operation mode with the duty cycle associated with each channel set at zero. The reconfigured digital PWM modules remain set in the independent operation mode for a predefined period of time. In some embodiments, a timer within the DSC is used to count the predefined time period. Once the predefined time period is reached, the reconfigured digital PWM modules are again reconfigured back to the original complementary operation mode configuration and the control algorithm resumes normal operation of the DSC and digital PWM modules. Modifying the control algorithm in this manner enables accurate control timing so that the operation mode change back to the original setting occurs only after the interval when random pulses may occur but before the first regular PWM signal with the desired duty cycle for normal operation is output.

In an aspect, a method of eliminating random pulses during power up of a device is disclosed. The method includes configuring each of one or more digital pulse width modulators within a switching mode power supply to operate in an independent operation mode and a complementary operation mode. The method also includes at power up of the switching mode power supply, operating each digital pulse width modulator in the independent operation mode and continuing to operate each digital pulse width modulator in the independent operation mode for a predetermined period of time. The method also includes changing the operation of each digital pulse width modulator from the independent operation mode to the complementary operation mode after the predetermined period of time expires, wherein changing the operation occurs during an initialization stage. The method also includes during a normal operation following the initialization stage, operating each digital pulse width modulator in the complementary operation mode. The method can also include monitoring a timing counter value and comparing the timing counter value to the predetermined period of time. The timing counter value can be provided by a software counter. Each digital pulse width modulator can include multiple channels, each channel supplies a pulse width modulated signal having a defined duty cycle, wherein the one or more digital pulse width modulators are configured for power factor correction interleaving operation. The duty cycle of each channel can be set to zero while in the independent operation mode during the initialization stage. Normal operation can be a normal power factor correction interleaving operation. Each of one or more digital pulse width modulators can generate a random pulse during power up when operating in the complementary operation mode.

In another aspect, another method of eliminating random pulses during power up of a device is disclosed. The method includes configuring a digital pulse width modulator within a switching mode power supply to operate in an independent operation mode and a complementary operation mode, wherein the digital pulse width modulator operates with a defined duty cycle for power factor correction interleaving operation. The method also includes at power up of the switching mode power supply, operating the digital pulse width modulator in the independent operation mode and continuing to operate the digital pulse width modulator in the independent operation mode for a predetermined period of time. The method also includes changing the operation of the digital pulse width modulator from the independent operation mode to the complementary operation mode after the predetermined period of time expires, wherein changing the operation occurs during an initialization stage. The method also includes during a normal power factor correction interleaving operation following the initialization stage, operating the digital pulse width modulator in the complementary operation mode. The method can also include monitoring a timing counter value and comparing the timing counter value to the predetermined period of time. The timing counter value can be provided by a software counter. The digital pulse width modulator can include multiple channels, each channel supplies a pulse width modulated signal having a defined duty cycle. The duty cycle of each channel can be set to zero while in the independent operation mode during the initialization stage. The digital pulse width modulator can generate a random pulse during power up when operating in the complementary operation mode.

In yet another aspect, an apparatus for eliminating random pulses during power up is disclosed. The apparatus includes one or more digital pulse width modulators each configured to operate in an independent operation mode and a complementary operation mode. The apparatus also includes a processor coupled to the one or more digital pulse width modulators. The processor includes program instructions configured to, at power up of the apparatus, operate each digital pulse width modulator in the independent operation mode and continue to operate each digital pulse width modulator in the independent operation mode for a predetermined period of time. The program instructions are also configured to change the operation of each digital pulse width modulator from the independent operation mode to the complementary operation mode after the predetermined period of time expires, wherein changing the operation occurs during an initialization stage. The program instructions are also configured to, during a normal operation following the initialization stage, operate each digital pulse width modulator in the complementary operation mode. The program instructions can also be configured to monitor a timing counter value and comparing the timing counter value to the predetermined period of time. The apparatus can also include a software counter and the timing counter value can be provided by the software counter. Each digital pulse width modulator can include multiple channels, each channel supplies a pulse width modulated signal having a defined duty cycle, wherein the one or more digital pulse width modulators are configured for power factor correction interleaving operation. The program instructions can also be configured to set the duty cycle of each channel to zero while in the independent operation mode during the initialization stage. Normal operation can be a normal power factor correction interleaving operation. Each of the one or more digital pulse width modulators can generate a random pulse during power up when operating in the complementary operation mode. The processor can be a digital signal controller or a microcontroller.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIG. 2 illustrates an exemplary output waveform of a digital PWM module 1, channel A (M1CHA) in independent operation mode during normal operation.

FIG. 3 illustrates an exemplary output waveform of a digital PWM module 2, channel A (M2CHA) in complementary operation mode with an exemplary digital PWM module 2, channel B (M2CHB) during normal operation.

FIG. 4 illustrates an exemplary output waveform of M2CHB in complementary operation mode with M2CHA during normal operation.

FIG. 5 illustrates an exemplary output waveform of M2CHB in complementary operation mode during power-up.

FIG. 6 illustrates an exemplary output waveform of M1CHA during power-up.

FIG. 7 illustrates an exemplary output waveform of M2CHB in complementary operation mode with a software counter.

FIG. 8 illustrates an exemplary output waveform of M2CHB in complementary operation mode with one time delay.

FIG. 9 illustrates an exemplary output waveform of M2CHB in complementary operation mode with N time delays.

FIG. 10 illustrates an exemplary output waveform of M2CHB in complementary operation mode with N+1 time delays.

DETAILED DESCRIPTION OF THE EMBODIMENTS

Embodiments of the present application are directed to a method of eliminating random voltage pulses during power up of a DSC. Those of ordinary skill in the art will realize that the following detailed description of the method is illustrative only and is not intended to be in any way limiting. Other embodiments of the method will readily suggest themselves to such skilled persons having the benefit of this disclosure.

Reference will now be made in detail to implementations of the method as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
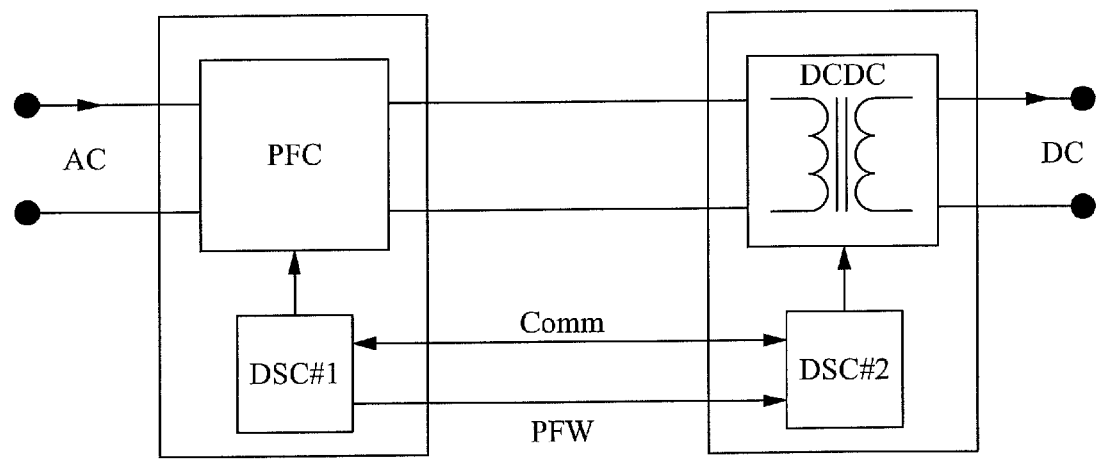
FIG. 1 illustrates a switching mode power supply unit under digital control for supplying power to a server.

In the exemplary application described below, the method of eliminating random pulses from a digital PWM module during power up is applied to a switching mode power supply. It is understood that this application is merely exemplary and that the method can be applied to alternative applications where a digital PWM module has random pulses during power up. FIG. 1 illustrates a switching mode power supply unit under digital control for supplying power to a server. The power supply unit includes a primary side for power factor correction (PFC) and AC-to-DC voltage conversion, and a secondary side for DC-to-DC voltage conversion. The primary side receives an AC input voltage, such as the main line AC voltage, and outputs a DC bus voltage, such as 400V. The secondary side converts the DC bus voltage output from the primary side to a desired DC voltage level that is used by a coupled load, such as 15V, 5V, or 3.3V. The PFC stage on the primary side is digitally controlled by a first digital signal controller (DSC). The DC-to-DC stage on the secondary side is digitally controlled by a second DSC. There is bi-directional or unidirectional communication signals sent between the first DSC and the second DSC. Subsequent reference to a DSC is directed to the first DSC.

The PFC front-end module can be configured as any conventional PFC circuit. In this exemplary application, the PFC front-end module is configured for interleaving operation. In some embodiments, the PFC front-end module includes one or more digital PWM modules each having one or more channels. For example, there can be three or four digital PWM modules, each of which consists of channel A, channel B, and in some cases an auxiliary channel. In some configurations, there is a single digital PWM module having multiple channels. In other configurations, there are multiple digital PWM modules, each digital PWM module configured to have one or more channels. For interleaving operation, channels within the same digital PWM module can be interleaved, but only for independent operation mode. Channels from different digital PWM modules can be interleaved in either complementary operation mode or independent operation mode. The channels are controlled by the DSC such that a duty cycle of each channel is established for desired interleaving operation. A control algorithm is executed by the DSC. In some embodiments, the control algorithm is stored and executed as firmware, as is well known in the art.

FIGS. 2-10 illustrate exemplary operation of a two digital PWM module, three channel PFC front-end module. One or more of the digital PWM modules is set to operate in the complementary operation mode during normal operation of the power supply unit. FIG. 2 illustrates an exemplary output waveform of a digital PWM module 1, channel A (M1CHA) in independent operation mode during normal operation. FIG. 3 illustrates an exemplary output waveform of a digital PWM module 2, channel A (M2CHA) in complementary operation mode with an exemplary digital PWM module 2, channel B (M2CHB) during normal operation. FIG. 4 illustrates an exemplary output waveform of the digital PWM module 2, channel B in complementary operation mode with the digital PWM module 2, channel A during normal operation. In this example, the digital PWM module 2 is set to work in complementary operation mode while digital PWM module 1 operates in independent operation mode, where the output of the digital PWM module 1, channel A and the output of the digital PWM module 2, channel B are phase-shifted 180 degree to achieve interleaving of two digital PWM modules.

The control algorithm includes executable instructions for controlling the digital PWM modules configured for both independent and complementary operation mode during normal operation. However, if the power supply unit is powered up and initialized while in the complementary operation mode, random pulses in the PWM signal may be generated, where a duration (width) of the random pulse can be greater, even much greater, than 100% of the switching cycle. FIG. 5 illustrates an exemplary output waveform of the digital PWM module 2, channel B in complementary operation mode during power-up. FIG. 5 shows a random pulse related to the channel (digital PWM module 2, channel B) set in complementary operation mode. FIG. 6 illustrates an exemplary output waveform of the digital PWM module 1, channel A during power-up. As shown in FIG. 6, no random pulse is generated in the digital PWM module 1, channel A in independent operation mode during power-up. Based on this characteristic, at the beginning of power-up, if the PWM channels that should be set in complementary operation mode are configured in independent operation mode, the random pulse is likely to disappear.

Furthermore, it is important to timely reconfigure the PWM channels back to the complementary operation mode immediately after a timeframe when a random pulse may be generated but before normal operation. This critical task is accomplished by utilizing firmware on a software-based counter. FIG. 7 illustrates an exemplary output waveform of the digital PWM module 2, channel B in complementary operation mode with a software counter. As shown in FIG. 7, the software counter is designed to start counting for generating desired time delay after power-up in either independent or complementary operation mode.

In the case where the relevant digital PWM channels, such as the digital PWM module 2, channel B, are reconfigured from independent operation mode back in complementary operation mode after one time delay, no random pulse manifests during the time delay. However, the time delay may not be long enough and the random pulse may manifest after the relevant PWM channels are reconfigured back in complementary operation mode. FIG. 8 illustrates an exemplary output waveform of the digital PWM module 2, channel B in complementary operation mode with one time delay that is shorter than the duration of the random pulse. In this case, the resulting width of the random pulse is reduced due to one time delay generated by the software-based counter. In a similar manner, if the number of time delays increases to 'N', the width of the random pulse may further be reduced. FIG. 9 illustrates an exemplary output waveform of the digital PWM module 2, channel B in complementary operation mode with N time delays. Eventually, after the number of time delays increases to a critical value, such as 'N+1', the random pulse totally disappears, as illustrated in FIG. 10. It is now the time to reconfigure the relevant PWM channels back to the complementary operation mode. In some embodiments, the entire process for eliminating the random pulse is controlled and implemented purely on firmware.

Accordingly, an initialization algorithm is executed at power up before the control algorithm executes the instructions for normal operation of the DSC and the digital PWM modules. In some embodiments, the initialization algorithm is implemented as a sub-routine of the control algorithm. At power up, the control algorithm is executed and the initialization algorithm is immediately called. In other embodiments, the initialization algorithm is a separate algorithm from the control algorithm and is executed prior to execution of the control algorithm.

The initialization algorithm can be considered part of a device initialization stage during which time the device is powered up and initialized before normal operation. The initialization algorithm is intended for use in those devices having a digital PWM module configured for complementary operation mode during normal operation. Since some DSC designs are known to generate PWM signals having random pulses during power up, the initialization algorithm temporarily changes the operation mode while powering up to the independent operation mode. The operation is temporarily changed for a predefined time period, it is during this predefined time period that random pulses are known to occur.

Figure 11:
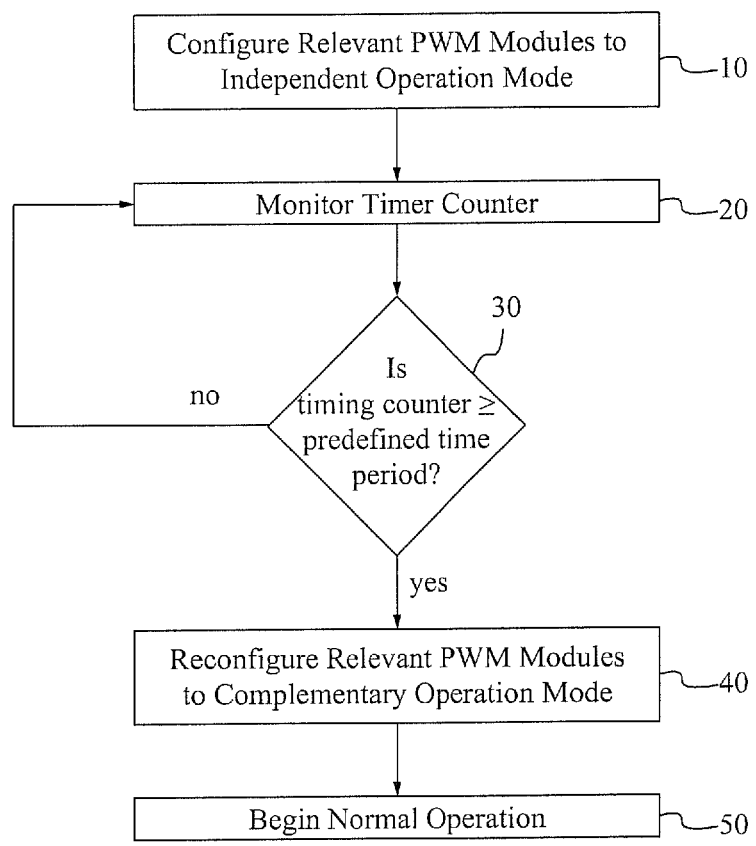
FIG. 11 illustrates an initialization algorithm according to an embodiment.

FIG. 11 illustrates an initialization algorithm according to an embodiment. The initialization algorithm provides a method of eliminating random pulses in the PWM signal during power up and is executed by the DSC. At the step 10, all digital PWM modules in the DSC that are to be operated in the complementary operation mode during normal operation are configured to operate in the independent operation mode. In some embodiments, the duty cycle associated with each channel of those digital PWM modules configured in step 10 is set to zero. The duty cycle is set to zero before normal operation so as to avoid any PWM signal that may result in over-current and possible damage to the internal components, thereby enabling safe start-up.

At the step 20, a timing counter is monitored. In some embodiments, the timing counter is a software counter used for normal operation of the firmware. Alternatively, other conventional timing mechanisms can be used. At the step 30, the timing counter value is compared to a predefined period of time. The predefined time period is determined as that period time during which random pulses may occur. In some embodiments, the predefined time period is determined empirically by monitoring the DSC while powering up in the complementary operation mode and measuring the time period over which random pulses are observed to occur. The predefined period of time is determined as a time period that is greater than this observed value. In some embodiments, the timing counter begins counting when the control algorithm begins, this corresponds to the initialization algorithm being a sub-routine within the control algorithm. In other embodiments, the timing counter begins when the initialization algorithm begins.

Once the timing counter value is equal to or greater than the predefined time period, then the initialization algorithm moves to the step 40. At the step 40, the PWM modules configured at the step 10 to operate in the independent operation mode are reconfigured to operate in the complementary operation mode. At the step 50, normal operation of the DSC and the digital PWM modules begins. In the case where the initialization algorithm is a sub-routine of the control algorithm, the sub-routine is exited and the control algorithm executes the code for normal operation. In the case where the initialization algorithm is a separate algorithm from the control algorithm, the initialization algorithm ends and the control algorithm begins.

The present application has been described in terms of specific embodiments incorporating details to facilitate the understanding of the principles of construction and operation of the method. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A method of eliminating random pulses during power up of a device, the method comprises:
   a. configuring each of one or more digital pulse width modulators within a switching mode power supply to operate in an independent operation mode and a complementary operation mode;
   b. at power up of the switching mode power supply, operating each digital pulse width modulator in the independent operation mode and continuing to operate each digital pulse width modulator in the independent operation mode for a predetermined period of time;
   c. changing the operation of each digital pulse width modulator from the independent operation mode to the complementary operation mode after the predetermined period of time expires, wherein changing the operation occurs during an initialization stage; and
   d. during a normal operation following the initialization stage, operating each digital pulse width modulator in the complementary operation mode.

2. The method of claim 1 further comprising monitoring a timing counter value and comparing the timing counter value to the predetermined period of time.

3. The method of claim 2 wherein the timing counter value is provided by a software counter.

4. The method of claim 1 wherein at least one of the one or more digital pulse width modulators includes multiple channels, each channel supplies a pulse width modulated signal having a defined duty cycle, wherein the one or more digital pulse width modulators are configured for power factor correction interleaving operation.

5. The method of claim 4 wherein the duty cycle of each channel is set to zero while in the independent operation mode during the initialization stage.

6. The method of claim 4 wherein during complementary operation mode a duty cycle of a first channel of the at least one digital pulse width modulator and a duty cycle of a second channel of the at least one digital pule width modulator are complementary of each other such that when the first channel is signal high the second channel is signal low, and when the first channel is signal low the second channel is signal high.

7. The method of claim 1 wherein each of one or more digital pulse width modulators generates a random pulse during power up if operating in the complementary operation mode instead of the independent operation mode.

8. A method of eliminating random pulses during power up of a device, the method comprises:
   a. configuring a digital pulse width modulator within a switching mode power supply to operate in an independent operation mode and a complementary operation mode, wherein the digital pulse width modulator operates with a defined duty cycle for power factor correction interleaving operation;
   b. at power up of the switching mode power supply, operating the digital pulse width modulator in the independent operation mode and continuing to operate the digital pulse width modulator in the independent operation mode for a predetermined period of time;
   c. changing the operation of the digital pulse width modulator from the independent operation mode to the complementary operation mode after the predetermined period of time expires, wherein changing the operation occurs during an initialization stage; and d. during a normal power factor correction interleaving operation following the initialization stage, operating the digital pulse width modulator in the complementary operation mode.

9. The method of claim 8 further comprising monitoring a timing counter value and comparing the timing counter value to the predetermined period of time.

10. The method of claim 9 wherein the timing counter value is provided by a software counter.

11. The method of claim 8 wherein the digital pulse width modulator includes multiple channels, each channel supplies a pulse width modulated signal having a defined duty cycle.

12. The method of claim 11 wherein the duty cycle of each channel is set to zero while in the independent operation mode during the initialization stage.

13. The method of claim 8 wherein the digital pulse width modulator generates a random pulse during power up if operating in the complementary operation mode instead of the independent operation mode.

14. An apparatus for eliminating random pulses during power up, the apparatus comprising:
   a. one or more digital pulse width modulators each configured to operate in an independent operation mode and a complementary operation mode; and
   b. a processor coupled to the one or more digital pulse width modulators, the processor comprises program instructions configured to:
      i. at power up of the apparatus, operating each digital pulse width modulator in the independent operation mode and continuing to operate each digital pulse width modulator in the independent operation mode for a predetermined period of time;
      ii. changing the operation of each digital pulse width modulator from the independent operation mode to the complementary operation mode after the predetermined period of time expires, wherein changing the operation occurs during an initialization stage; and
      iii. during a normal operation following the initialization stage, operating each digital pulse width modulator in the complementary operation mode.

15. The apparatus of claim 14 wherein the program instructions are further configured to monitor a timing counter value and comparing the timing counter value to the predetermined period of time.

16. The apparatus of claim 15 wherein the apparatus further comprises a software counter and the timing counter value is provided by the software counter.

17. The apparatus of claim 14 wherein each digital pulse width modulator includes multiple channels, each channel supplies a pulse width modulated signal having a defined duty cycle, wherein the one or more digital pulse width modulators are configured for power factor correction interleaving operation.

18. The apparatus of claim 17 wherein the program instructions are further configured to set the duty cycle of each channel to zero while in the independent operation mode during the initialization stage.

19. The apparatus of claim 14 wherein normal operation comprises normal power factor correction interleaving operation.

20. The apparatus of claim 14 wherein each of the one or more digital pulse width modulators generates a random pulse during power up if operating in the complementary operation mode instead of the independent operation mode.

21. The apparatus of claim 14 wherein the processor comprises a digital signal controller or a microcontroller.

\* \* \* \* \*